(12) United States Patent
Wong et al.

(10) Patent No.: US 11,742,630 B2
(45) Date of Patent: *Aug. 29, 2023

(54) DIFFRACTIVE OPTICAL ELEMENT WITH OFF-AXIS INCIDENCE FOR STRUCTURED LIGHT APPLICATION

(71) Applicant: Lumentum Operations LLC, San Jose, CA (US)

(72) Inventors: Vincent V. Wong, Los Altos, CA (US); Yonghong Guo, Union City, CA (US); Jay A. Skidmore, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 17/446,874

(22) Filed: Sep. 3, 2021

(65) Prior Publication Data

US 2021/0399516 A1    Dec. 23, 2021

Related U.S. Application Data

(63) Continuation of application No. 16/168,398, filed on Oct. 23, 2018, now Pat. No. 11,114,816.

(Continued)

(51) Int. Cl.
  *G02B 27/44* (2006.01)
  *H01S 5/00* (2006.01)
  (Continued)

(52) U.S. Cl.
  CPC ........ *H01S 5/0085* (2013.01); *G02B 27/0944* (2013.01); *G02B 27/1093* (2013.01);
  (Continued)

(58) Field of Classification Search
  CPC ...... H01S 5/0085; H01S 5/005; H01S 5/0071; G02B 27/0944; G02B 27/30
  (Continued)

(56) References Cited

U.S. PATENT DOCUMENTS

6,765,724 B1 * 7/2004 Kramer .................... G03F 7/40
                                                                  359/566
8,384,997 B2    2/2013 Shpunt et al.
(Continued)

OTHER PUBLICATIONS

Bell T., et al., "Structured Light Techniques and Applications," https://onlinelibrary.wilry.com/doi/full/10.1002/047134608X. W8298, Feb. 15, 2016, 24 pages.

(Continued)

*Primary Examiner* — Audrey Y Chang
(74) *Attorney, Agent, or Firm* — Harrity & Harrity, LLP

(57) ABSTRACT

A structured light system may include a semiconductor laser to emit light and a diffractive optical element to diffract the light such that one or more diffracted orders of the light, associated with forming a structured light pattern, are transmitted by the diffractive optical element. The diffractive optical element may be arranged such that the light is to be incident on the diffractive optical element at a substantially non-normal angle of incidence. The substantially non-normal angle of incidence may be designed to cause the diffractive optical element to transmit a zero-order beam of the light outside of a field of view associated with the diffractive optical element.

20 Claims, 5 Drawing Sheets

Related U.S. Application Data

(60) Provisional application No. 62/583,280, filed on Nov. 8, 2017.

(51) Int. Cl.
  *G02B 27/09* (2006.01)
  *G02B 27/10* (2006.01)
  *G02B 27/30* (2006.01)
  *G02B 27/20* (2006.01)

(52) U.S. Cl.
  CPC .............. *H01S 5/005* (2013.01); *G02B 27/20* (2013.01); *G02B 27/30* (2013.01); *H01S 5/0071* (2013.01)

(58) Field of Classification Search
  USPC .................................................. 359/569, 566
  See application file for complete search history.

(56) References Cited

U.S. PATENT DOCUMENTS

| | | | | |
|---|---|---|---|---|
| 11,114,816 | B2* | 9/2021 | Wong | G02B 27/1093 |
| 2002/0060846 | A1* | 5/2002 | Hayashi | G02B 7/008 |
| | | | | 359/569 |
| 2007/0146473 | A1 | 6/2007 | Masuda et al. | |
| 2007/0263204 | A1* | 11/2007 | Ju | G01B 9/02 |
| | | | | 356/4.09 |
| 2007/0268585 | A1* | 11/2007 | Santoro | F21S 11/00 |
| | | | | 359/599 |
| 2013/0182327 | A1* | 7/2013 | Miyasaka | G01B 11/25 |
| | | | | 359/566 |
| 2014/0139844 | A1 | 5/2014 | Oigawa | |
| 2017/0033122 | A1 | 2/2017 | Zaitsu et al. | |
| 2017/0188016 | A1 | 6/2017 | Hudman et al. | |
| 2017/0227416 | A1 | 8/2017 | Chen et al. | |
| 2017/0287151 | A1 | 10/2017 | Han et al. | |
| 2018/0084241 | A1 | 3/2018 | Chen et al. | |

OTHER PUBLICATIONS

Capasso F., et al., "Delivering VR in Perfect Focus with Nanostructure Meta-Lenses," https://theconversation.com/delivering-vr-in-perfect-focus-with-nanostructure-meta-lenses-89726, Apr. 23, 2018, 5 pages.
Flenup J.R., "Phase Retrieval Algorithms: A Comparison," https://www.osapublishing.org/DirectPDFAccess/51DOE7B1-00D4-1D21-07142CC44C61AEDO_26002/ao-21-15-2758.pdf?da=1&id=26002&seq=0&moblie=no, 1982, vol. 21(15), pp. 2758-2769.
International Conference on Machine Learning, Beijing, China, 2014, https://cs.stanford.edu/~qoucle/paragraph vector.pdf, 9 pages.
Pertsch T., et al., "Diffractive Optical Elements made from Photonic Metamaterials," https://www.spiedigitallibrary.org/conference-proceeding-of-spie/9626/962604/Diffractive-optical-elements-made-from-photonic-metematerials/10.1117/12.2195726.full?SSo=1, Sep. 23, 2015, 34 pages.
RPC Photonics, "Diffractive Optics Used to Produce Arbitrary Phase and Amplitude Distributions," https://rpcphotonics.com/product/diffractive-optics/, Nov. 5, 2007, 7 pages.
Wikipedia, "Phase retrieval," https://en,wikipedia.org/wiki/Phase_retrieval, Jan. 26, 2018, 3 pages.

* cited by examiner

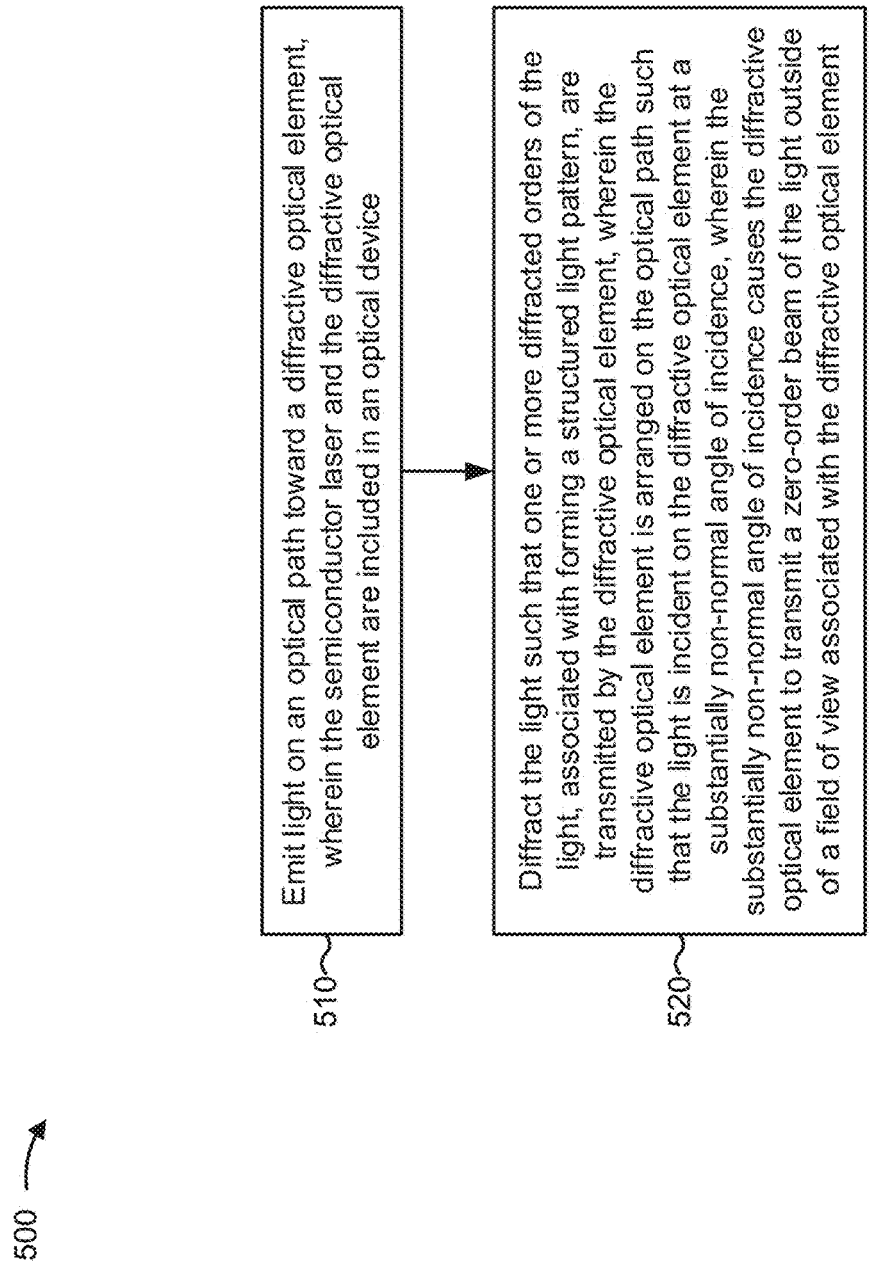

DIFFRACTIVE OPTICAL ELEMENT WITH OFF-AXIS INCIDENCE FOR STRUCTURED LIGHT APPLICATION

RELATED APPLICATION

This application is a continuation of U.S. patent application Ser. No. 16/168,398, filed Oct. 23, 20118 (now U.S. Pat. No. 11,114,816), which claims priority under 35 U.S.C. § 119 to U.S. Provisional Patent Application No. 62/583,280, filed on Nov. 8, 2017, the contents of both of which are incorporated herein by reference in their entireties.

TECHNICAL FIELD

The present disclosure relates to a diffractive optical element and, more particularly, to a diffractive optical element with off-axis incidence in a structured light application.

BACKGROUND

In a structured light application, such as a three-dimensional (3D) sensing application, a structured light system may include a diffractive optical element. The diffractive optical element can be used to generate spots (e.g., tens of thousands of spots, each with approximately equal power) from light output by a semiconductor laser diode (by transmitting multiple diffracted orders of the light). Depending on design requirements, the diffractive optical element can include microstructures at two phase levels (i.e., the diffractive optical element can be a binary diffractive optical element) or more than two phase levels (i.e., the diffractive optical element can be a multi-level diffractive optical element) in order to diffract the light into the spots at an output of the diffractive optical element. An angular extent of the diffraction occurs over a range of angles relative to the surface of the diffractive optical element referred to as a field of view (FOV). The FOV can be for example, a 60° FOV, a 90° FOV, or the like. The semiconductor laser diode can be either a vertical-cavity surface-emitting laser (VCSEL) or an edge-emitting (EE) laser. Light emitted by the semiconductor laser diode is collimated, and the collimated light is incident on the diffractive optical element at normal incidence.

SUMMARY

According to some possible implementations, a structured light system may include a semiconductor laser to emit light; and a diffractive optical element to diffract the light such that one or more diffracted orders of the light, associated with forming a structured light pattern, are transmitted by the diffractive optical element, wherein the diffractive optical element is arranged such that the light is to be incident on the diffractive optical element at a substantially non-normal angle of incidence, wherein the substantially non-normal angle of incidence is designed to cause the diffractive optical element to transmit a zero-order beam of the light outside of a field of view associated with the diffractive optical element.

According to some possible implementations, an optical device, may include an emitter to emit light; and a diffractive optical element to transmit one or more diffracted orders of the light and a zero-order beam of the light, wherein the diffractive optical element is arranged such that the light is to be incident on the diffractive optical element at a substantially non-normal angle of incidence, wherein the substantially non-normal angle of incidence is to designed cause the diffractive optical element to transmit the zero-order beam outside of a field of view associated with the one or more diffracted orders, and wherein the one or more diffracted orders of the light are to be used in association with forming a structured light pattern.

According to some possible implementations, an optical system may include an emitter to emit light; and a dot pattern generator to generate a dot pattern, wherein the dot pattern is to be generated by a diffractive optical element that transmits one or more diffracted orders of the light, wherein the light is to be incident on the diffractive optical element at a substantially non-normal angle of incidence, wherein the substantially non-normal angle of incidence is to cause a zero-order beam of the light to be transmitted outside of a field of view associated with the diffractive optical element.

According to some possible implementations, a method may include: emitting, by a semiconductor laser, light on an optical path toward a diffractive optical element, wherein the semiconductor laser and the diffractive optical element are included in an optical device; and diffracting, by the diffractive optical element, such that one or more diffracted orders of the light, associated with forming a structured light pattern, are transmitted by the diffractive optical element, wherein the diffractive optical element is arranged on the optical path such that the light is incident on the diffractive optical element at a substantially non-normal angle of incidence, wherein the substantially non-normal angle of incidence causes the diffractive optical element to transmit a zero-order beam of the light outside of a field of view associated with the diffractive optical element.

According to some possible implementations, a method may include: emitting, by an emitter, light on an optical path toward a diffractive optical element such that the light is incident on the diffractive optical element; and transmitting, by the diffractive optical element, one or more diffracted orders of the light including a zero-order beam of the light, wherein the light is to be incident on the diffractive optical element at a substantially non-normal angle of incidence, wherein the substantially non-normal angle of incidence causes the diffractive optical element to transmit the zero-order beam outside of a field of view associated with the one or more diffracted orders.

According to some possible implementations, a method may include: emitting, by an emitter, light to be used in association with generating a dot pattern; and generating, by a dot pattern generator, the dot pattern, wherein the dot pattern is generated by a diffractive optical element, included in the dot pattern generator, that transmits one or more diffracted orders of the light, wherein the light is incident on the diffractive optical element at a substantially non-normal angle of incidence, wherein the substantially non-normal angle of incidence causes a zero-order beam of the light to be transmitted outside of a field of view associated with the diffractive optical element.

BRIEF DESCRIPTION OF THE DRAWINGS

FIG. 5 is a flow chart of an example process associated with transmitting, by a diffractive optical element, one or more diffracted orders of light, including a zero-order beam, wherein the light is incident on the diffractive optical element at a substantially non-normal angle of incidence such that the zero-order beam is transmitted outside of a FOV associated with the diffractive optical element, as described herein.

DETAILED DESCRIPTION

Figure 1:
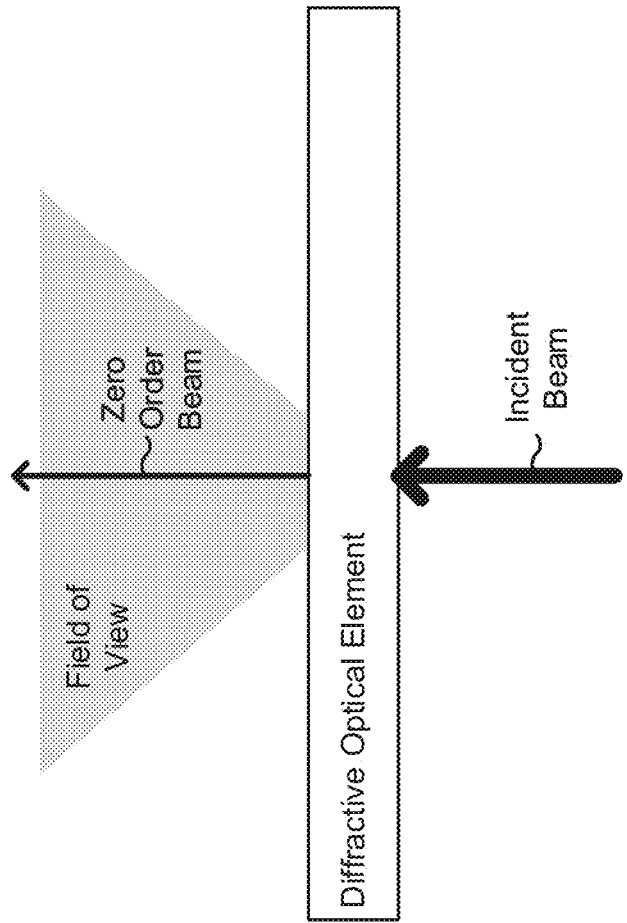
FIG. 1 is a diagram illustrating a prior art optical system in which a beam of light is incident on a diffractive optical element at normal incidence.

The following detailed description of example implementations refers to the accompanying drawings. The same reference numbers in different drawings may identify the same or similar elements.

As described above, a diffractive optical element can be used in a structured light system in association with generating a dot pattern (e.g., a structured light pattern). In practice, a given diffractive optical element includes fabrication errors in depth (e.g., errors that occur during etching) and errors in width/length (e.g., errors that occur during lithographic patterning of the microstructures). These fabrication errors cause some portion of the light to be transmitted by the diffractive optical element without being diffracted. This un-diffracted portion of the light is referred to as a zero-order beam. The zero-order beam is transmitted by the diffractive optical element at the same angle at which the light is incident on the diffractive optical element. Thus, when the light is incident on the diffractive optical element at normal incidence, the zero-order beam is transmitted by the diffractive optical element normal to the diffractive optical element. For an ideal diffractive optical element (e.g., a diffractive optical element fabricated without any errors), an amount of power in the zero-order beam can be minimized or eliminated. However, in practice, diffractive optical elements are non-ideal and, therefore, a zero-order beam will be present.

The power performance of a structured light system can be limited by an amount of power in the zero-order beam. For example, since the zero-order beam is conventionally transmitted normal to the surface of the diffractive optical element, the zero-order beam is within the FOV associated with the diffractive optical element. As such, the amount of power in the zero-order beam may need to satisfy a safety threshold (e.g., an eye safety threshold). Typically, the zero-order beam contains approximately 1-2% of the total power in the output of the diffractive optical element. However, since the diffractive optical element typically generates a significant number (e.g., tens of thousands) of diffraction orders or spots, this total amount of power in the zero-order beam is significantly greater than an amount of power in any other diffraction order. Thus, since the zero-order beam is within the FOV when the light is incident on the diffractive optical element at normal incidence, safety compliance (e.g., eye safety compliance) is limited by the amount of power in the zero-order beam.

Further, the normal incidence of the light on the diffractive optical element may cause back-reflection (e.g., into a laser chip) which results in prevents instability in performance (e.g., wavelength, power, beam profile, and/or the like). Additionally, the normal angle of incidence of the light on the diffractive optical element can result in interference effects from input and output surfaces of the diffractive optical element, in some cases.

FIG. 1 illustrates a prior art optical system in which a beam of light is incident on a diffractive optical element at normal incidence. As shown in FIG. 1, the light is incident on the diffractive optical element at normal incidence. As such, a zero-order beam of the light, transmitted by the diffractive optical element, is transmitted at normal relative to the surface of the diffractive optical element and, therefore, is present in the FOV associated with the diffractive optical element. Although not shown in FIG. 1, the diffractive optical element transmits other diffracted orders of the light within the FOV (e.g., for the purpose of forming a dot pattern). Here, the presence of the zero-order beam in the FOV is problematic in terms of system performance and/or safety compliance, as described above.

Some implementations described herein provide a structured light system including a diffractive optical element, associated with generating a dot pattern (e.g., a structured light pattern), where the diffractive optical element is arranged such that light is to be incident on the diffractive optical element at a substantially non-normal angle of incidence (e.g., at least approximately 10° away from normal incidence). Here, the substantially non-normal angle of incidence may be selected such that the diffractive optical element transmits a zero-order beam of the light outside of a FOV, associated with the diffractive optical element, while the diffractive optical element transmits other diffracted orders within the FOV (in association with generating the dot pattern). Thus, the zero-order beam power is not within the FOV, which permits a total power in the FOV to be increased or maximized, thereby allowing system performance to be improved while maintaining safety compliance.

Further, the non-normal incidence of the light on the diffractive optical element can reduce back-reflection (e.g., into a laser chip), which prevents instability in performance (e.g., wavelength, power, beam profile, and/or the like) that could result from such back-reflection. Additionally, the non-normal angle of incidence of the light can reduce interference effects from input and output surfaces of the diffractive optical element (e.g., in a case in which the input surface and/or the output surface is not AR-coated).

Figure 2:
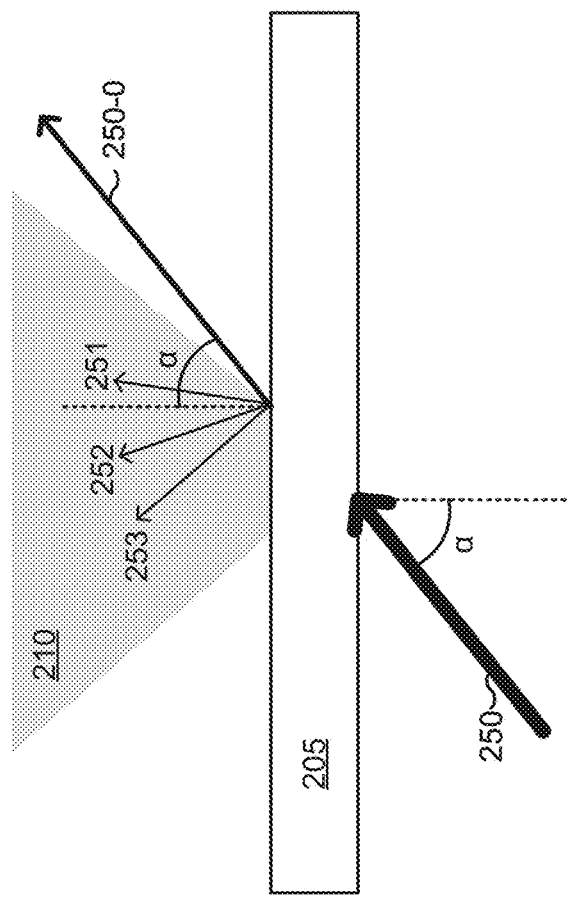
FIG. 2 is a diagram illustrating an example associated with an optical system in which a beam of light is incident on a diffractive optical element at a substantially non-normal incidence such that a zero-order beam is transmitted outside of a field of view associated with the diffractive optical element, as described below.

FIG. 2 is a diagram illustrating an example of an optical system 200. As shown, in FIG. 2, a beam of light 250 is incident on a diffractive optical element 205 at a substantially non-normal angle of incidence α (e.g., an angle that is at least approximately 10° away from normal). Due to the substantially non-normal angle of incidence α, as shown in FIG. 2, a zero-order beam 250-0 is transmitted at angle α, which causes zero-order beam 250-0 to be outside of a FOV 210 associated with diffractive optical element 205.

As further shown in FIG. 2, within FOV 210, diffractive optical element 205 may transmit diffracted orders of the light that can be used to form a dot pattern. While only three diffracted orders are shown in FIG. 2 (e.g., first diffracted order 251, second diffracted order 252, and third diffracted order 253), this is for illustrative purposes. In practice, diffractive optical element 205 may transmit a significant number of diffracted orders (e.g., tens of thousands of diffracted orders). As shown, in some implementations, diffractive optical element 205 is designed such that the substantially non-normal angle of incidence causes diffractive optical element 205 to transmit the diffracted orders asymmetrically with respect to zero-order beam 250-0 (e.g., such that the diffracted orders are directed to only one side of zero-order beam 250-0). In some implementations, diffractive optical element 205 may be designed to provide this asymmetrical transmission, as described in further detail below.

Notably, diffractive optical element 205 is used to diffract light 250, having a predominantly single wavelength, such that diffracted orders of light 250, each having the same wavelength, are directed to respective locations in space (or at respective angles in angular space) in association with generating the dot pattern. This differs from the use of a diffractive optical element in, for example, a wavelength selective switching application in which different wavelength channels, included in an input beam, are directed on the basis of wavelength in order to differently direct each of the wavelength channels.

In some implementations, the dot pattern generated by optical system 200 can be used in, for example, a three-dimensional sensing (3DS) application, an optical communication application, a human-computer interaction application, a medical application, a biological application, an entertainment application, a security application, a manufacturing application, an application associated with remote environment reconstruction, or another type of structured light application.

FIG. 2 is provided as an example for illustrative purposes, and other examples are possible. Additional details regarding optical system 200 are provided below. Further, the size and arrangement of components shown in FIG. 2 are provided as examples. In practice, there may be additional components, fewer components, different components, differently arranged components, differently sized trenches and/or layers, trenches and/or layers with different relative sizes, and/or the like.

Figure 3:
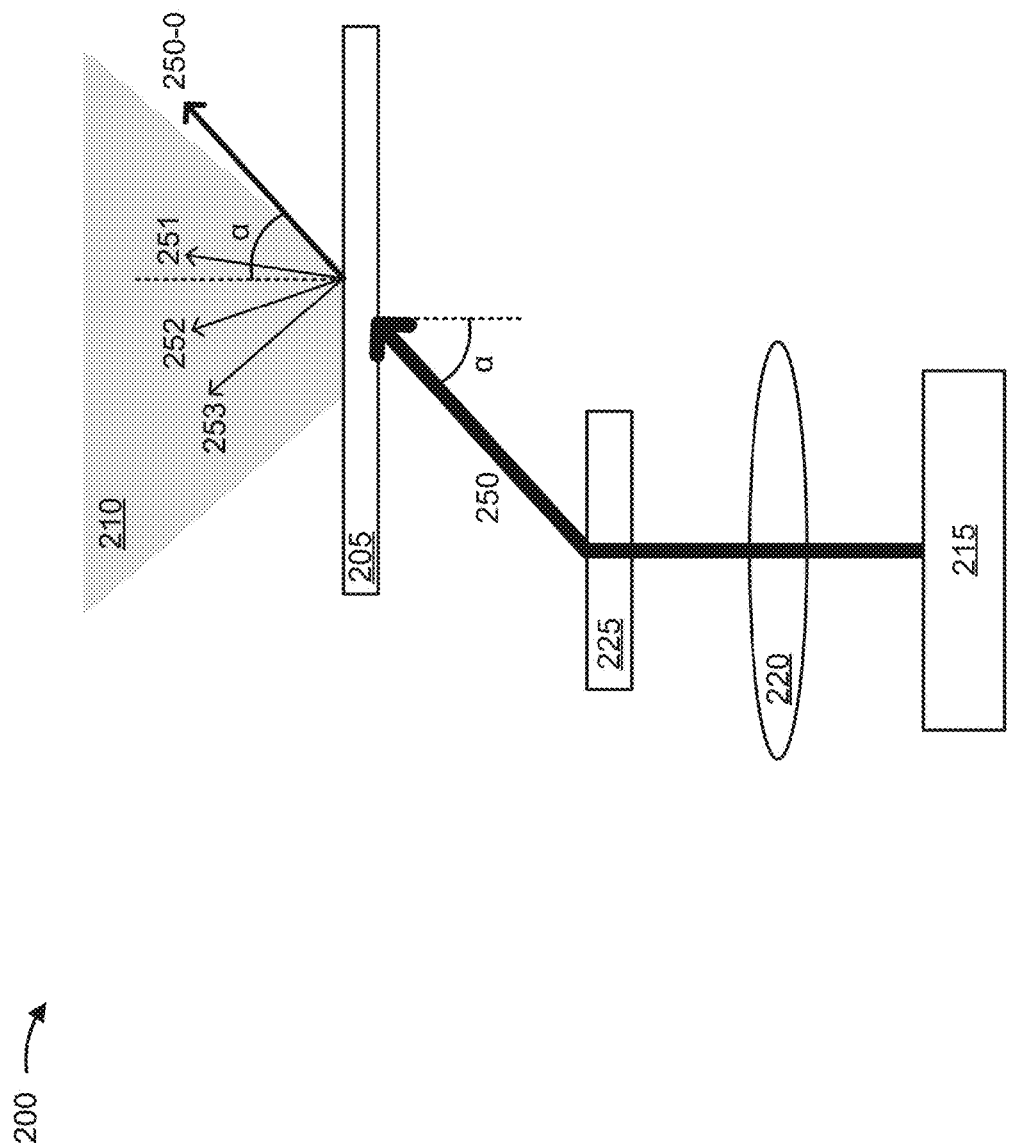
FIG. 3 is a diagram of example components of the optical system associated with FIG. 2.

FIG. 3 is a diagram of example components of optical system 200. Optical system 200 includes one or more optical devices associated with providing a dot pattern (e.g., a structured light pattern). In some implementations, optical system 200 may be referred to as a structured light system. As shown in FIG. 3, optical system 200 may include diffractive optical element 205, an emitter 215, collimating optics 220, and a beam deflector 225 (e.g., a mirror).

Diffractive optical element 205 includes an optical component capable of diffracting light 250, incident on diffractive optical element 205, such that diffracted orders of light 250 (e.g., diffracted order 251, diffracted order 252, diffracted order 253, and so on) are provided by diffractive optical element 205, as described herein. In other words, diffractive optical element 205 is an optical component capable of diffracting light 250 in association with forming a desired intensity pattern (e.g., a circular dot pattern, a rectangular dot pattern, a square dot pattern, a linear dot pattern, or any other arbitrary pattern) from the diffracted orders of light 250.

In some implementations, as shown in FIG. 3, the diffracted orders of light 250 are transmitted by diffractive optical element 205 within FOV 210 associated with diffractive optical element 205, while zero-order beam 250-0 of light 250 is transmitted such that zero-order beam 250-0 is outside of FOV 210. In some implementations, optical system 200 is designed such that light 250 is incident on diffractive optical element 205 at a substantially non-normal angle of incidence α (e.g., at least approximately 10° away from normal incidence) in order to cause zero-order beam 250-0 to be transmitted outside of FOV 210. For example, in a case where FOV 210 is a 60° FOV, optical system 200 may be designed such that light 250 is incident on diffractive optical element 205 at an angle α that is greater than 30°.

In some implementations, in order to provide the functionality described herein, diffractive optical element 205 may be a multi-level diffractive optical element (i.e., a diffractive optical element that includes more than two phase levels such that diffractive optical element 205 has a multi-level profile) or a continuous-relief diffractive optical element 205 (i.e., diffractive optical element may have a continuous profile). In some implementations, a number and/or arrangement of phase levels of diffractive optical element 205 may selected based on requirements for relative intensity of the diffraction orders to be transmitted by diffractive optical element 205, a required angle of FOV 210, a number of spots or diffracted orders to be transmitted in FOV 210, and/or the like. In some implementations, diffractive optical element 205 can be formed from, for example, silicon, silica, quartz glass, and/or another type of material.

In some implementations, diffractive optical element 205 may be capable of generating an asymmetric output with respect to zero-order beam 250-0 that is transmitted by diffractive optical element 205. For example, diffractive optical element 205 may be designed such that the diffracted orders of light (e.g., diffracted order 251, diffracted order 252, diffracted order 253, and so on) are directed only to one side of zero-order beam 250-0, as shown in FIG. 3. In some implementations, diffractive optical element 205 includes a profile (e.g., a profile with multiple phase levels, a continuous profile, and/or the like) that causes the diffracted orders of the light to be transmitted at diffraction angles that put the diffracted orders of the light within FOV 210 of diffractive optical element 205, while zero-order beam 250-0 is transmitted outside of FOV 210 (due to the substantially non-normal angle of incidence α at which light 250 is incident on diffractive optical element 205).

Emitter 215 includes one or more optical devices capable of emitting light 250 to be diffracted by diffractive optical element 205. For example, emitter 215 may include an EE laser, a VCSEL, a light emitting diode (LED), a laser, or another type of semiconductor-based light source. In some implementations, emitter 215 is designed such that, during operation, emitter 215 emits light 250 at a predominately single wavelength (e.g., such that light 250, emitted by emitter 215, is within approximately 10 nanometers (nm) of a design wavelength). In other words, in some implementations, emitter 215 may be capable of emitting narrowband light. In some implementations, the predominately single wavelength may be a wavelength between approximately 800 nm and 1100 nm.

In some implementations, emitter 215 may include multiple light emitting devices (e.g., a VCSEL array, an array of EE lasers, a LED array, and/or the like), each configured to emit respective light 250 at respective predominately single wavelengths. In such a case, a given portion of diffractive optical element 205 may be designed to diffract a respective beam of light 250 incident thereon (e.g., each portion of diffractive optical element 205 may be designed to diffract light 250 emitted by a different emitting device).

Collimating optics 220 includes an (optional) optical component to collimate light 250 prior to light 250 being incident on diffractive optical element 205. For example, collimating optics 220 may include a lens (e.g., a circular lens) or a group of lenses. In some implementations, as shown in FIG. 3, collimating optics 220 may be arranged such that collimating optics 220 collimates light 250 prior to light 250 being incident on beam deflector 225. Alternatively, collimating optics 220 may be arranged such that collimating optics 220 collimates light 250 after light 250 is directed by beam deflector 225. In some implementations, collimating optics 220 may include one or more discrete optical components (e.g., one or more lenses arranged on an optical path between emitter 215 and beam deflector 225 and/or on an optical path between beam deflector 225 and diffractive optical element 205) and/or one or more integrated optical components (e.g., one or more lenses integrated with or affixed to emitter 215 and/or diffractive optical element 205).

Beam deflector 225 includes one or more optical components to deflect and/or direct light 250, emitted by emitter 215, such that light 250 is incident on diffractive optical element 205 at substantially non-normal angle of incidence α. For example, beam deflector 225 may include one or more mirrors (e.g., one or more planar mirrors, one or more curved mirrors, one or more MEMS mirrors, and/or the like) and/or another type of optical component to direct light 250. In some implementations, beam deflector 225 may be arranged on an optical path between emitter 215 and diffractive optical element 205.

In some implementations, while not shown, optical system 200 may include a beam block (i.e., a beam dump) to prevent zero-order beam 250-0 from exiting optical system 200. For example, optical system 200 may include a beam dump arranged to absorb zero-order beam 250-0 such that zero-order beam 250-0 is prevented from exiting optical system 200 (or returning to FOV 210).

The number, size, and arrangement of components of optical system 200 shown are provided as examples. In practice, there may be additional components, fewer components, different components, differently arranged components, differently sized trenches and/or layers, trenches and/or layers with different relative sizes, and/or the like, than those shown in FIG. 3. For example, in some implementations, optical system 200 may be configured without beam deflector 225. In such a case, emitter 215 can be arranged such that light 250 is directed at diffractive optical element 205 at a substantially non-normal angle of incidence α (without being deflected by another optical component).

Figure 4:
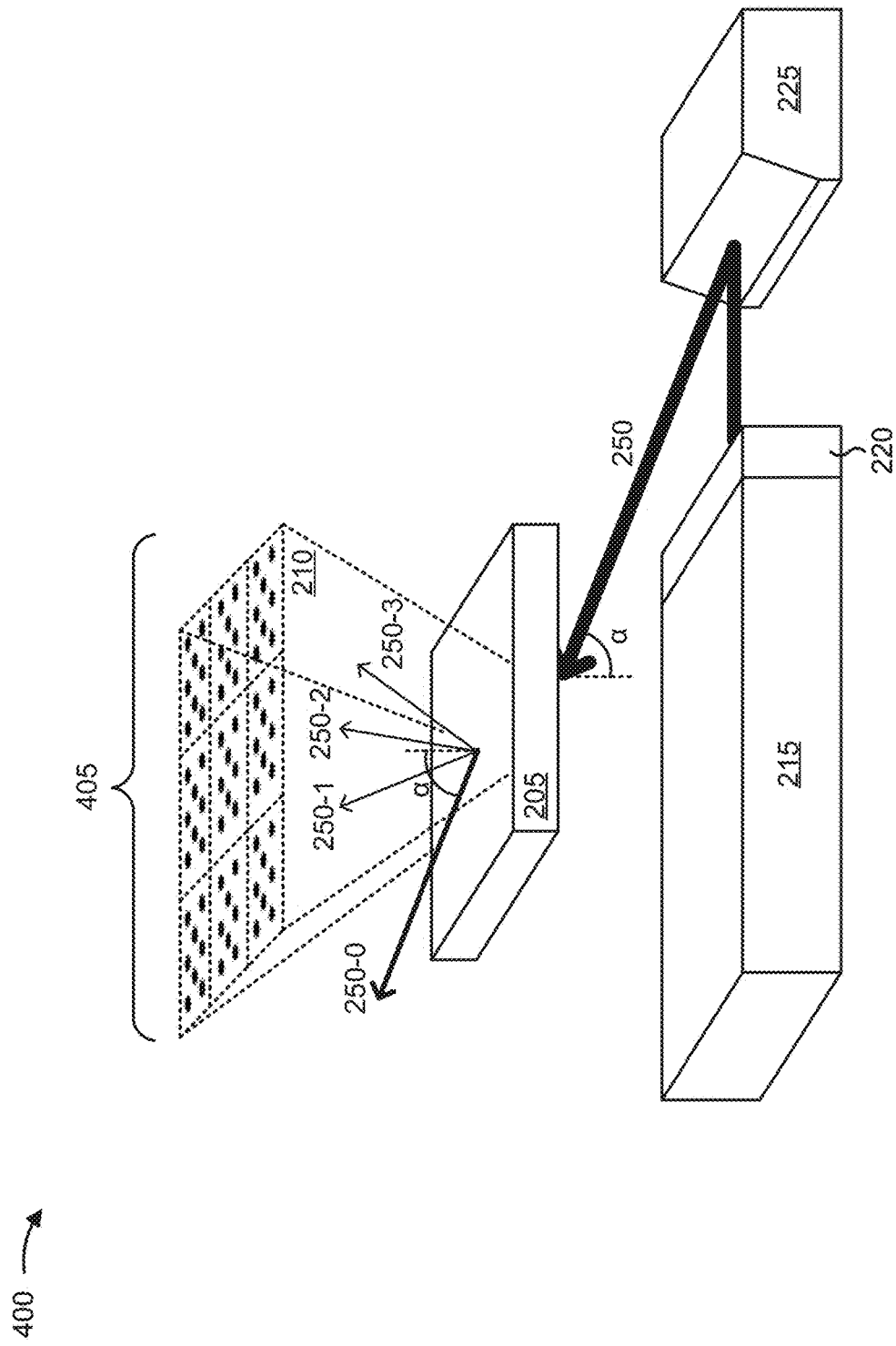
FIG. 4 is a diagram of an example implementation of the optical system of FIG. 3.

FIG. 4 is a diagram of example implementation 400 of optical system 200. As shown in FIG. 4, light 250 (having a predominately single wavelength) is emitted by emitter 215, and is collimated by collimated optics 220 (e.g., collimating optics which are integrated with or affixed to emitter 215 or on a common carrier with emitter 215). As further shown, collimated light 250 is incident on a surface of beam deflector 225, which reflects collimated light 250 at a particular angle. As further shown, after being reflected by beam deflector 225, collimated light 250 is incident on a bottom surface of diffractive optical element 205 at a substantially non-normal angle of incidence α. As further shown, due to the substantially non-normal angle of incidence α at which collimated light 250 is incident on the bottom surface of diffractive optical element 205, zero-order beam 250-0 is transmitted from a top surface of diffractive optical element 205 at angle α. As shown, due to transmission of zero-order beam 250-0 at angle α, zero-order beam 250-0 is outside of a FOV 210 associated with diffractive optical element 205. In this way, zero-order beam 250-0 may be transmitted outside of FOV 210, which allows for optical performance to be improved or maximized. For example, since zero-order beam 250-0 is not transmitted within FOV 210, an amount of optical power in zero-order beam 250-0 is not a significant eye safety concern and, therefore, an amount of optical power in light 250 may be increased. Further, the non-normal incidence α can reduce back-reflection (e.g., into a laser chip), thereby preventing instability in performance (e.g., wavelength, power, beam profile, and/or the like) that could result from such back-reflection. Additionally, the non-normal angle of incidence α reduces interference effects from input and output surfaces of diffractive optical element 205 (e.g., in a case in which the input surface and/or the output surface is not AR-coated).

However, as further shown in FIG. 4, diffractive optical element 205 transmits diffracted orders of collimated light 250 within FOV 210. As shown, a dot pattern 405 can be formed based on the diffracted orders transmitted by diffractive optical element 205 in FOV 210. As indicated in FIG. 4, diffractive optical element 205 is designed such that the substantially non-normal angle of incidence causes diffractive optical element 205 to transmit the diffracted orders asymmetrically with respect to zero-order beam 250-0. As used herein, the term asymmetrically is defined as diffraction orders being transmitted on one side of zero-order beam 250 (e.g., either predominantly negative orders or predominantly positive orders) including a predominant portion of the total power diffracted in all diffraction orders (e.g., the total power diffracted in all negative and positive orders). The predominant portion of the total power can be described as a percentage of (e.g., at least approximately 90%) of the total power transmitted by diffractive optical element 205 in all orders, as a ratio of relative power transmitted by diffractive optical element 205 on either side of zero-order beam 2500 (e.g., a ratio of approximately 10:1), and/or the like. As a particular example, diffractive optical element 205 can be designed such that at least approximately 90% of the total power transmitted by diffractive optical element 205 is in negative orders transmitted on one side of the zero-order beam 250. As another particular example, diffractive optical element 205 can be designed such that the total power diffracted by diffractive optical element 205 is transmitted in positive orders and negative orders at a 10:1 ratio (e.g., such that the power transmitted in the positive orders is 10 times greater than the power transmitted in the negative orders).

The number, size, and arrangement of components shown in FIG. 4 are provided as examples. In practice, there may be additional components, fewer components, different components, differently arranged components, differently sized trenches and/or layers, trenches and/or layers with different relative sizes, and/or the like, than those shown.

FIG. 5 is a flow chart of an example process 500 associated with transmitting, by a diffractive optical element, one or more diffracted orders of light, including a zero-order beam, wherein the light is incident on the diffractive optical element at a substantially non-normal angle of incidence such that the zero-order beam is transmitted outside of a FOV associated with the diffractive optical element. In some implementations, one or more process blocks of FIG. 5 may be performed by one or more devices of optical system 200 (e.g., emitter 215, diffractive optical element 205, and/or the like).

As shown in FIG. 5, process 500 may include emitting light on an optical path toward a diffractive optical element, wherein the semiconductor laser and the diffractive optical element are included in an optical device (block 510). For example, emitter 215 may emit light 250 on an optical path toward diffractive optical element 205, wherein emitter 215 and diffractive optical element 205 are included in optical system 200, as described above.

As further shown in FIG. 5, process 500 may include diffracting the light such that one or more diffracted orders of the light, associated with forming a structured light pattern, are transmitted by the diffractive optical element (block 520). For example, diffractive optical element 205 may diffract light 250 such that one or more diffracted orders of light 250, associated with forming a structured light pattern, are transmitted by diffractive optical element 205, as described above. In some implementations, diffractive optical element 205 is arranged on the optical path such that light 250 is incident on diffractive optical element 205 at a substantially non-normal angle of incidence α. Here, the substantially non-normal angle of incidence α causes diffractive optical element 205 to transmit zero-order beam 250-0 outside of FOV 210 associated with diffractive optical element 205, as described above.

Process 500 may include additional implementations, such as any single implementation or any combination of implementations described below and/or in connection with one or more other processes described elsewhere herein. Further, although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

For example, in some implementations, process 500 may include emitting light 250 on an optical path toward diffractive optical element 205 such that light 250 is incident on diffractive optical element 205; and transmitting one or more diffracted orders of light 250 including zero-order beam 250-0. Here, light 250 may be incident on diffractive optical element 205 at a substantially non-normal angle of incidence α that causes diffractive optical element 205 to transmit zero-order beam 250-0 outside of FOV 210 associated with the one or more diffracted orders, as described herein.

As another example, in some implementations, process 500 may include emitting light 250 to be used in association with generating a dot pattern; and generating, by a dot pattern generator (e.g., include diffractive optical element 205), the dot pattern. Here, the dot pattern may be generated by diffractive optical element 205 that transmits one or more diffracted orders of light 250. Here, light 250 may be incident on diffractive optical element 205 at a substantially non-normal angle of incidence α, which causes zero-order beam 250-0 to be transmitted outside of FOV 210 associated with diffractive optical element 205.

Some implementations described herein provide an optical system 200 (e.g., a structured light system) including diffractive optical element 205, associated with generating a dot pattern (e.g., a structured light pattern), where diffractive optical element 205 is arranged such that light 250 is to be incident on diffractive optical element 205 at a substantially non-normal angle of incidence α (e.g., at least approximately 10° away from normal incidence). Here, the substantially non-normal angle of incidence α may be selected such that diffractive optical element 205 transmits a zero-order beam 250-0 of light 250 outside of a FOV 210, associated with diffractive optical element 205, while diffractive optical element 205 transmits other diffracted orders within FOV 210 (in association with generating the dot pattern). Thus, zero-order beam 250-0 power is not within FOV 210, which permits a total power in FOV 210 to be increased or maximized, thereby allowing system performance to be improved while maintaining safety compliance (e.g., eye safety compliance).

Further, the non-normal incidence α can reduce back-reflection (e.g., into a laser chip), thereby preventing instability in performance (e.g., wavelength, power, beam profile, and/or the like) that could result from such back-reflection. Additionally, the non-normal angle of incidence α reduces interference effects from input and output surfaces of diffractive optical element 205 (e.g., in a case in which the input surface and/or the output surface is not AR-coated).

The foregoing disclosure provides illustration and description, but is not intended to be exhaustive or to limit the implementations to the precise form disclosed. Modifications and variations are possible in light of the above disclosure or may be acquired from practice of the implementations. For example, while optical system 200 is described in the context of a diffractive optical element 205 configured to transmit diffracted orders of light 250 and zero-order beam 250-0 of light 250 in association with putting zero-order beam 250-0 outside of FOV 210, in some optical systems, diffractive optical element 205 may be configured to reflect diffracted orders of light 250 and zero-order beam 250-0 of light 250 in order to achieve a similar effect.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical system, comprising:
    an emitter to emit light; and
    a diffractive optical element to diffract the light,
        wherein the diffractive optical element includes a profile that causes the diffractive optical element to transmit multiple diffracted orders of the light at a particular wavelength and asymmetrically with respect to a zero-order beam, such that at least 90% of the light is transmitted in the multiple diffracted orders on one side of the zero-order beam.

2. The optical system of claim 1, wherein the diffractive optical element is arranged such that the light is to be incident on the diffractive optical element at a substantially non-normal angle of incidence.

3. The optical system of claim 2, wherein the substantially non-normal angle of incidence causes the diffractive optical element to transmit the zero-order beam outside of a field of view of the optical system.

4. The optical system of claim 2, further comprising:
    a beam deflector to cause the light to be incident on the diffractive optical element at the substantially non-normal angle of incidence.

5. The optical system of claim 1, wherein the profile of the diffractive optical element includes more than two phase levels.

6. The optical system of claim 1, wherein the light transmitted by the diffractive optical element forms a dot pattern.

7. The optical system of claim 1, wherein the zero-order beam and the multiple diffracted orders have a same wavelength.

8. A structured light system, comprising:
   an emitter to emit light;
   a collimating component to collimate the light; and
   a diffractive optical element to diffract the light after collimation,
      wherein the diffractive optical element includes a profile that causes the diffractive optical element to transmit multiple diffracted orders of the light at a particular wavelength and asymmetrically with respect to a zero-order beam, such that at least 90% of the light is transmitted in multiple diffracted orders on one side of the zero-order beam.

9. The structured light system of claim 8, wherein the diffractive optical element is arranged such that the light is to be incident on the diffractive optical element at a substantially non-normal angle of incidence.

10. The structured light system of claim 9, wherein the substantially non-normal angle of incidence causes the diffractive optical element to transmit the zero-order beam outside of a field of view of the structured light system.

11. The structured light system of claim 9, further comprising:
    a beam deflector to cause the light to be incident on the diffractive optical element at the substantially non-normal angle of incidence.

12. The structured light system of claim 8, wherein the profile of the diffractive optical element includes more than two phase levels.

13. The structured light system of claim 8, wherein the diffractive optical element is a multi-level diffractive optical element or a continuous-relief diffractive optical element.

14. The structured light system of claim 8, wherein the emitter is an edge-emitting laser or a vertical-cavity surface-emitting laser.

15. An optical device, comprising:
    a semiconductor laser to emit light; and
    a pattern generator to generate a pattern from the light,
       wherein the pattern generator comprises a diffractive optical element, and
       wherein the diffractive optical element includes a profile that causes the diffractive optical element to transmit multiple diffracted orders of the light at a particular wavelength and asymmetrically with respect to a zero-order beam, such that at least 90% of the light is transmitted in the multiple diffracted orders on one side of the zero-order beam.

16. The optical device of claim 15, wherein the diffractive optical element is arranged such that the light is to be incident on the diffractive optical element at a substantially non-normal angle of incidence.

17. The optical device of claim 16, wherein the substantially non-normal angle of incidence causes the diffractive optical element to transmit the zero-order beam outside of a field of view of the optical device.

18. The optical device of claim 16, further comprising:
    a beam deflector to cause the light to be incident on the diffractive optical element at the substantially non-normal angle of incidence.

19. The optical device of claim 15, wherein the profile of the diffractive optical element includes more than two phase levels.

20. The optical device of claim 15, wherein the pattern comprises a dot pattern.

* * * * *